(12) United States Patent
Hopkins et al.

(10) Patent No.: US 11,889,683 B2
(45) Date of Patent: Jan. 30, 2024

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Darwin A. Clampitt, Wilder, ID (US); Michael J. Puett, Boise, ID (US); Christopher R. Ritchie, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 16/918,129

(22) Filed: Jul. 1, 2020

(65) Prior Publication Data

US 2022/0005817 A1    Jan. 6, 2022

(51) Int. Cl.
*H10B 41/27* (2023.01)
*H01L 23/522* (2006.01)
(Continued)

(52) U.S. Cl.
CPC ......... *H10B 41/27* (2023.02); *H01L 23/5226* (2013.01); *H10B 41/10* (2023.02);
(Continued)

(58) Field of Classification Search
CPC .......... H01L 29/7808; H01L 27/11273; H01L 29/7802; H01L 29/66712; H01L 27/11517;
(Continued)

(56) References Cited

U.S. PATENT DOCUMENTS 5,189,504 A    2/1993  Nakayama et al.
6,949,829 B2   9/2005  Akahori et al.
(Continued)

FOREIGN PATENT DOCUMENTS

TW    530380    5/2003

OTHER PUBLICATIONS

Mackus et al., "From the Bottom-Up: Toward Area-Selective Atomic Layer Deposition with High Selectivity", Chemistry of Materials vol. 31, 2019, United States, pp. 2-12.
(Continued)

*Primary Examiner* — Mary A Wilczewski
*Assistant Examiner* — Tsz K Chiu
(74) *Attorney, Agent, or Firm* — Wells St. John P.S.

(57) ABSTRACT

A method used in forming a memory array comprising strings of memory cells comprises forming a stack comprising vertically-alternating first tiers and second tiers. A channel-material string is in individual channel openings in the vertically-alternating first tiers and second tiers. A conductor-material contact is in the individual channel openings directly against the channel material of individual of the channel-material strings. The conductor-material contacts are vertically recessed in the individual channel openings. A conductive via is formed in the individual channel openings directly against the vertically-recessed conductor-material contact in that individual channel opening. Other aspects, including structure independent of method, are disclosed.

14 Claims, 9 Drawing Sheets

(51) Int. Cl.
  *H10B 43/27* (2023.01)
  *H10B 43/10* (2023.01)
  *H10B 41/10* (2023.01)
  *H10B 43/35* (2023.01)

(52) U.S. Cl.
  CPC ............ *H10B 43/10* (2023.02); *H10B 43/27* (2023.02); *H10B 43/35* (2023.02)

(58) Field of Classification Search
  CPC ............ H01L 29/788; H01L 29/42324; H01L 29/66825; H01L 29/792; H01L 2924/13081; H01L 2924/13085; H01L 29/6684; H01L 29/78391; H01L 29/4236; H01L 27/11524; H01L 27/1157; H01L 27/11578; H01L 27/11582; H01L 23/5226; H01L 23/5283; H01L 21/76816; H01L 21/76865; H01L 21/76877; H01L 21/76831; H10B 43/27; H10B 41/35; H10B 41/41; H10B 41/27; H10B 43/35; H10B 43/40; H10B 43/10; H10B 43/50
  See application file for complete search history.

(56) References Cited

U.S. PATENT DOCUMENTS

| | | | | |
|---|---|---|---|---|
| 8,072,024 | B2 * | 12/2011 | Ishikawa | H01L 29/4234 438/386 |
| 8,829,595 | B2 * | 9/2014 | Lee | H01L 27/11582 257/E21.21 |
| 9,305,849 | B1 * | 4/2016 | Tsutsumi | H01L 27/1157 |
| 10,340,286 | B2 * | 7/2019 | Goda | H01L 27/11582 |
| 10,388,667 | B2 * | 8/2019 | Carlson | H01L 29/40117 |
| 10,453,855 | B2 * | 10/2019 | Carlson | H01L 29/40117 |
| 10,566,346 | B2 * | 2/2020 | Lee | H01L 27/11568 |
| 10,804,291 | B1 * | 10/2020 | Rajashekhar | H01L 27/11582 |
| 11,404,583 | B2 * | 8/2022 | Goda | H01L 27/11556 |
| 2004/0041266 | A1 | 3/2004 | Akahori et al. | |
| 2008/0108193 | A1 | 5/2008 | You et al. | |
| 2010/0140684 | A1 | 6/2010 | Ozawa | |
| 2011/0049607 | A1 | 3/2011 | Yahashi | |
| 2012/0211816 | A1 | 8/2012 | Yahashi | |
| 2012/0235163 | A1 | 9/2012 | Watanabe | |
| 2013/0161731 | A1 * | 6/2013 | Bin | H01L 29/7926 438/269 |
| 2013/0164922 | A1 | 6/2013 | Cho et al. | |
| 2013/0270631 | A1 | 10/2013 | Kim et al. | |
| 2014/0312398 | A1 | 10/2014 | Ching et al. | |
| 2015/0194441 | A1 | 7/2015 | Yatsuda et al. | |
| 2015/0236038 | A1 | 8/2015 | Pachamuthu et al. | |
| 2015/0294980 | A1 * | 10/2015 | Lee | H01L 21/76877 438/591 |
| 2015/0364488 | A1 | 12/2015 | Pachamuthu et al. | |
| 2015/0372005 | A1 | 12/2015 | Yon et al. | |
| 2016/0008692 | A1 | 1/2016 | Townsend | |
| 2016/0043100 | A1 | 2/2016 | Lee et al. | |
| 2016/0071861 | A1 | 3/2016 | Serov et al. | |
| 2016/0093524 | A1 | 3/2016 | Izumi et al. | |
| 2016/0260733 | A1 * | 9/2016 | Lue | H01L 21/32133 |
| 2016/0260735 | A1 | 9/2016 | Lee et al. | |
| 2016/0315095 | A1 | 10/2016 | Sel et al. | |
| 2017/0263556 | A1 | 9/2017 | Tessariol et al. | |
| 2017/0301685 | A1 | 10/2017 | Dorhout et al. | |
| 2019/0067326 | A1 * | 2/2019 | Huang | H01L 29/165 |
| 2019/0198520 | A1 * | 6/2019 | Kim | H01L 21/0217 |
| 2019/0259698 | A1 * | 8/2019 | Takahashi | H01L 27/11575 |
| 2019/0312050 | A1 * | 10/2019 | Lai | H10B 43/27 |
| 2019/0393238 | A1 * | 12/2019 | Lim | H01L 27/11582 |
| 2020/0058673 | A1 * | 2/2020 | Nishikawa | H01L 27/11548 |
| 2020/0127004 | A1 | 4/2020 | Dorhout et al. | |
| 2021/0202751 | A1 * | 7/2021 | Goda | H01L 29/6675 |
| 2021/0399112 | A1 * | 12/2021 | Lee | H01L 29/1037 |

OTHER PUBLICATIONS

U.S. Appl. No. 16/574,417, filed Sep. 18, 2019 by Hopkins et al.
U.S. Appl. No. 16/675,901, filed Nov. 6, 2019 by Hopkins et al.
U.S. Appl. No. 16/682,349, filed Nov. 13, 2019 by Kong et al.
U.S. Appl. No. 16/682,544, filed Nov. 13, 2019 by Bhushan et al.
U.S. Appl. No. 16/728,723, filed Dec. 27, 2019 by Chandolu et al.
U.S. Appl. No. 16/743,329, filed Jan. 15, 2020 by Jain et al.
U.S. Appl. No. 16/793,263, filed Feb. 18, 2020 by Vahdat et al.
U.S. Appl. No. 16/918,392, filed Jul. 1, 2020 by Greenlee et al.

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power, Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-14.

FIGS. 1-5 show an example construction 10 having an array 12 in which elevationally-extending strings 49 of transistors and/or memory cells 56 have been formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. In some embodiments, conductive tiers 22 are referred to as first tiers 22 and insulative tiers 20 are referred to as second tiers 20. The example method is described as being gate-first although it could alternately be gate-last (or other method. Accordingly, first/conductive tiers 22 may not comprise conducting material and second/insulative tiers 20 may not comprise insulative material or be insulative at this point in processing.

Example thickness for each of tiers 20 and 22 is 22 to 60 nanometers. The example uppermost tier 20 may be thicker/thickest compared to one or more other tiers 20 and/or 22, Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a direction 55. Any alternate existing or future-developed arrangement and construction may be used.

Figure 1:
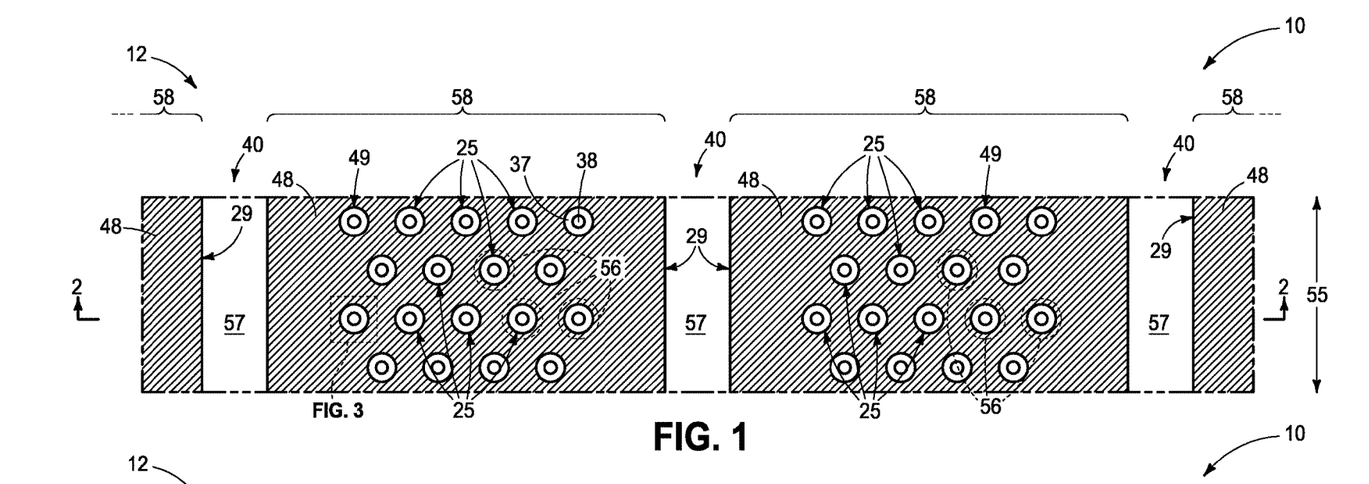
FIG. 1 is a diagrammatic cross-sectional view of a portion of a substrate in process in accordance with an embodiment of the invention and is taken through line 1-1 in FIG. 2.
Figure 2:
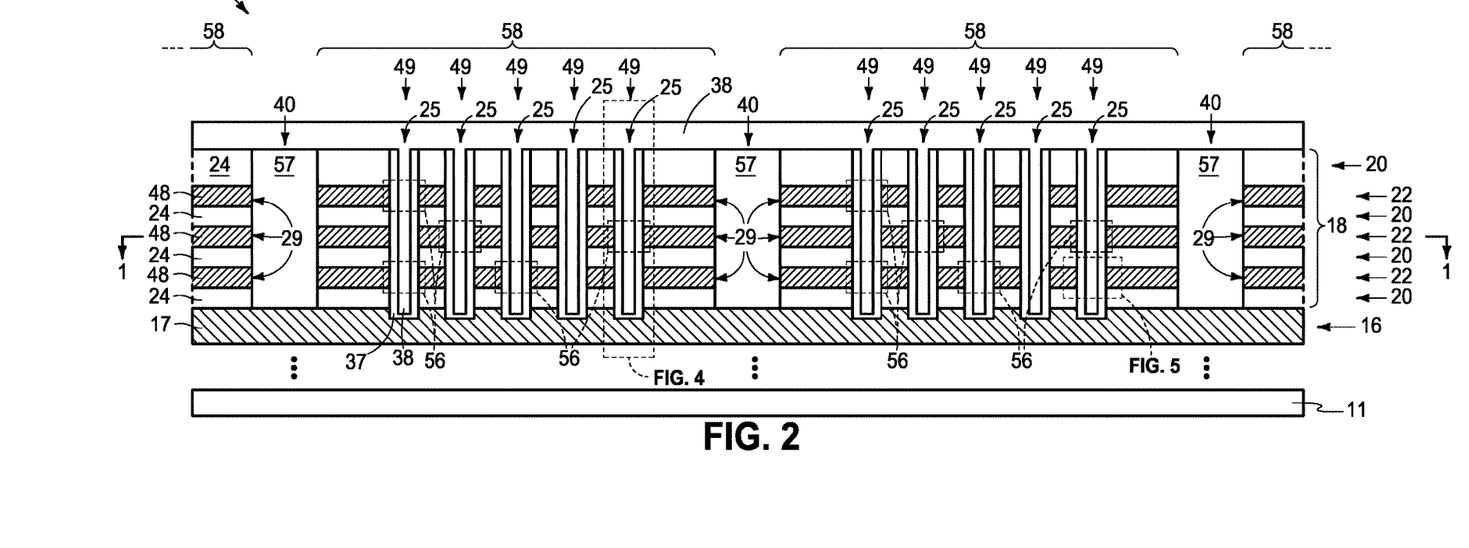
FIG. 2 is a diagrammatic cross-sectional view taken through line 2-2 in FIG. 1.
Figure 3:
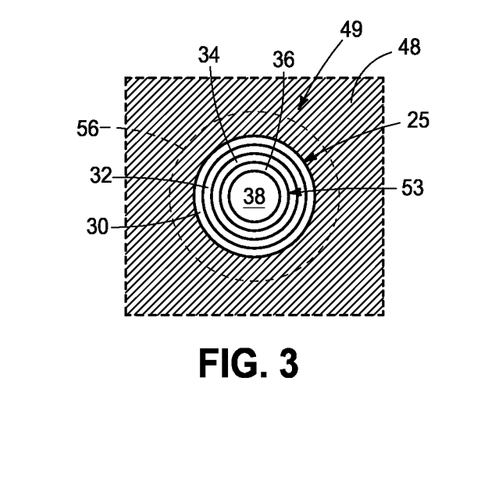
FIGS. 3-5 are enlarged views of portions of FIGS. 1 and 2.

Example memory blocks 58 are shown as at least in part having been defined by horizontally-elongated trenches 40 that were formed (e.g., by anisotropic etching) into stack 18. Trenches 40 may have respective bottoms that are directly against conductor material 17 (e.g., atop or within) of conductor tier 16 (as shown) or may have respective bottoms that are above conductor material 17 of conductor tier 16 (not shown). Intervening material 57 is in trenches 40 in stack 18 and may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (TAV's) and not shown.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaII). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown).

Example conductive tiers 22 comprise conducting material 48 that is part of individual conductive lines 29 (e.g., wordlines) that are also part of elevationally-extending strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in FIG. 5 and some with dashed outlines in FIGS. 1-4, with transistors acid/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 5) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 4:
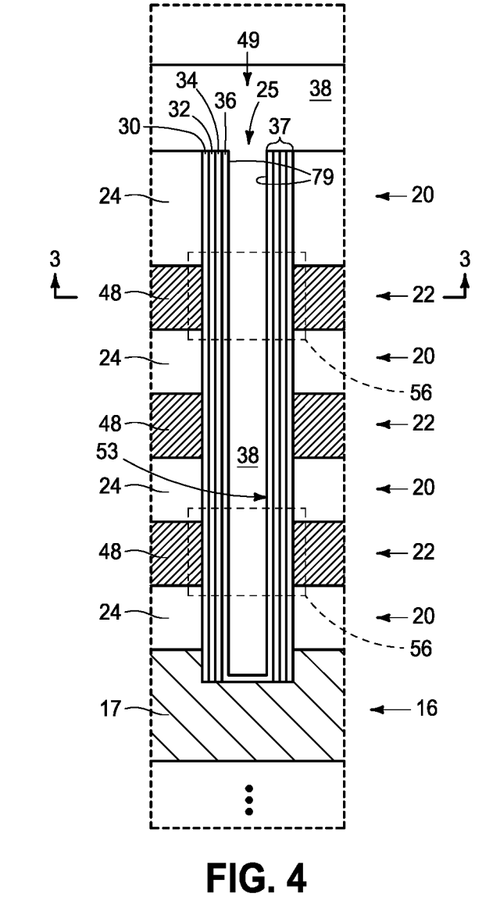
Figure 5:
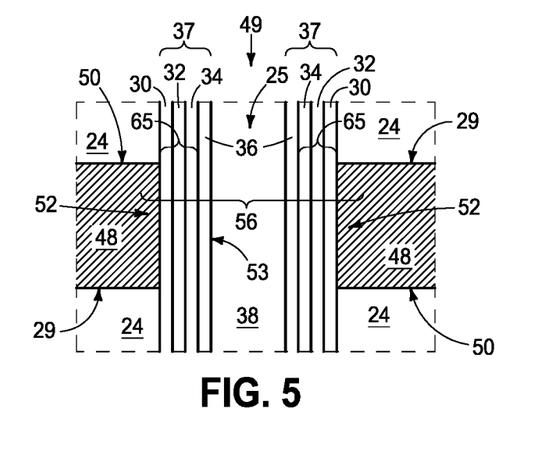

In one embodiment and as shown, channel-material strings 53 individually comprise a cylindrical shell, with storage material (e.g., 32) being radially outside such cylindrical shell. Alternately, and by way of example only, the channel-material strings may be solid pillars of channel material radially completely there-across (not shown). In the example embodiment, insulator material 38 (e.g., spin-on-dielectric, silicon dioxide, and/or silicon nitride) has been deposited atop uppermost second tier 20 and radially inside of the cylindrical shells of channel-material strings 53. Depending on timing of fabrication of the illustrated materials, material 37 may be atop uppermost tier 20 at this point in processing (not shown), with insulator material 38 being there-atop (not shown). The cylindrical shells of channel-material strings 53 may be considered as comprising radially-inner sides 79 (FIG. 4).

Figure 6:
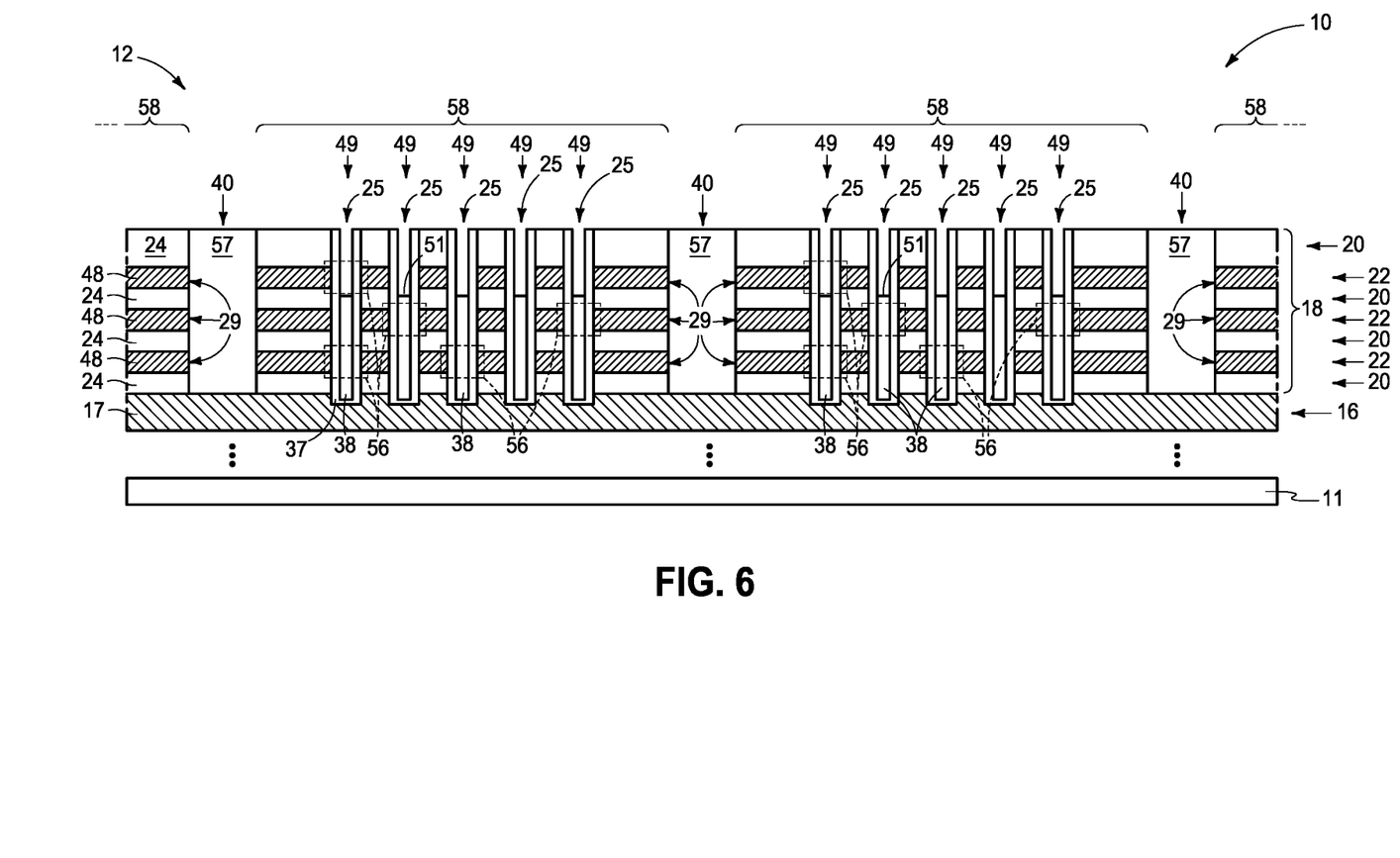
FIGS. 6-14 are diagrammatic sequential sectional, expanded, enlarged, and/or partial views of the construction of FIGS. 1-5, or portions thereof, in process in accordance with some embodiments of the invention.

Referring to FIG. 6, insulator material 38 in individual channel openings 25 has been vertically recessed (e.g., by wet or dry etching) relative to storage material 32 and relative to channel material 36 (i.e., at least relative to such materials). In one embodiment, such vertical recessing positions a top 51 of insulator material 38 below uppermost first tier 22.

Figure 7:
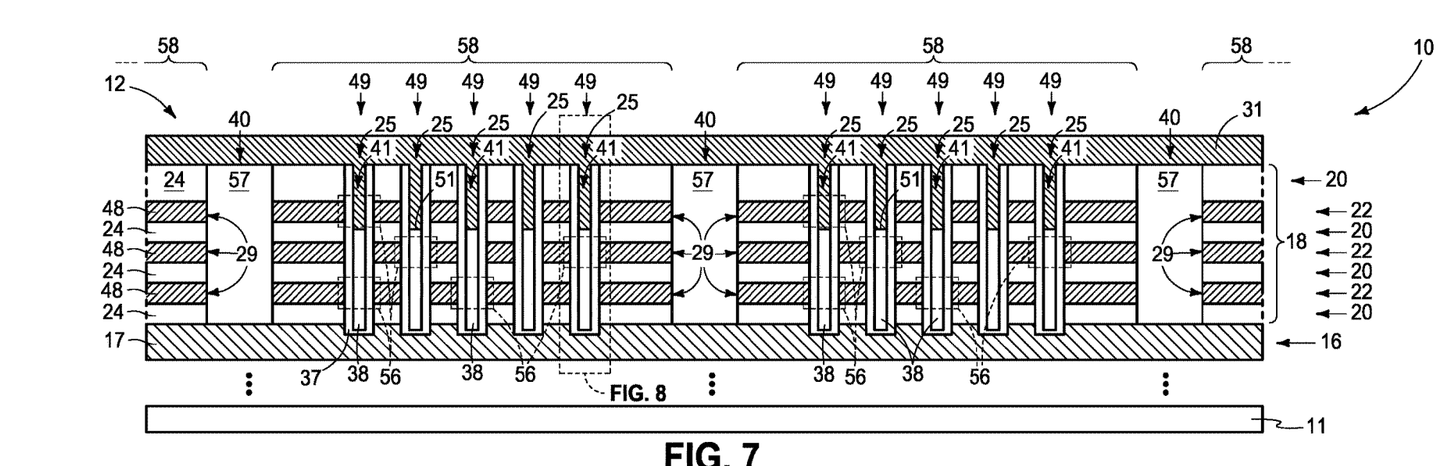
Figure 8:
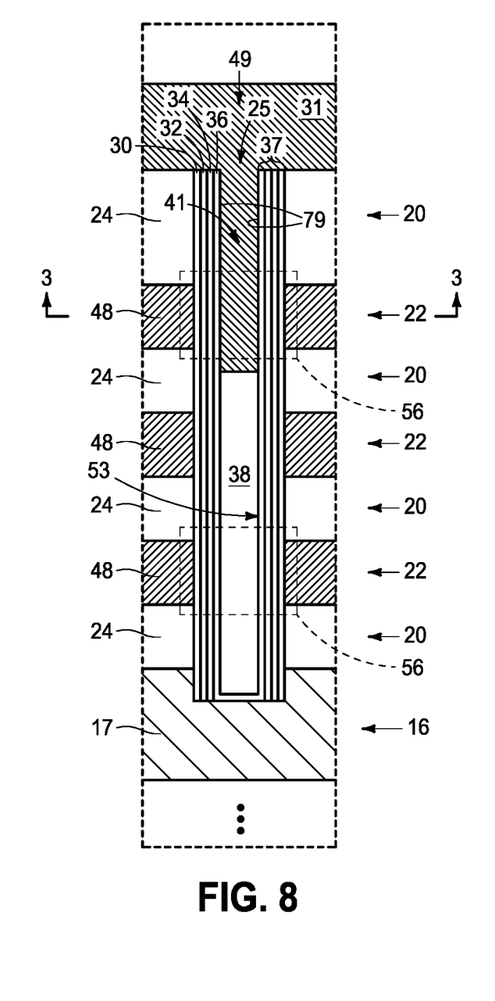

Referring to FIGS. 7 and 8, a conductor material 31 has been formed as part of construction 10, thereby forming a conductor-material contact 41 in individual channel openings 25 radially inside of and directly against radially-inner sides 79 of the cylindrical shell of channel material 36 of individual channel-material strings 53 and atop vertically-recessed insulator material 38. In one embodiment, conductor material 31 comprises conductively-doped semiconductive material, such as conductively-doped polysilicon and in one embodiment channel material 36 comprises undoped or channel-doped polysilicon that may have increased doped concentration therein where contacted by conductor material 31 due to out-diffusion therefrom.

Figure 9:
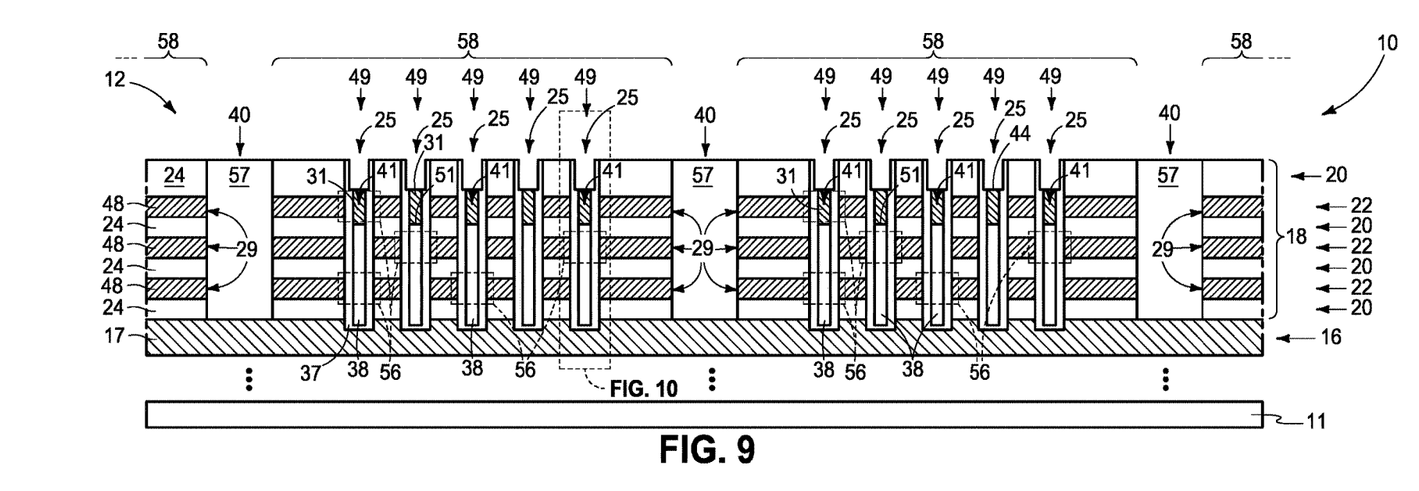
Figure 10:
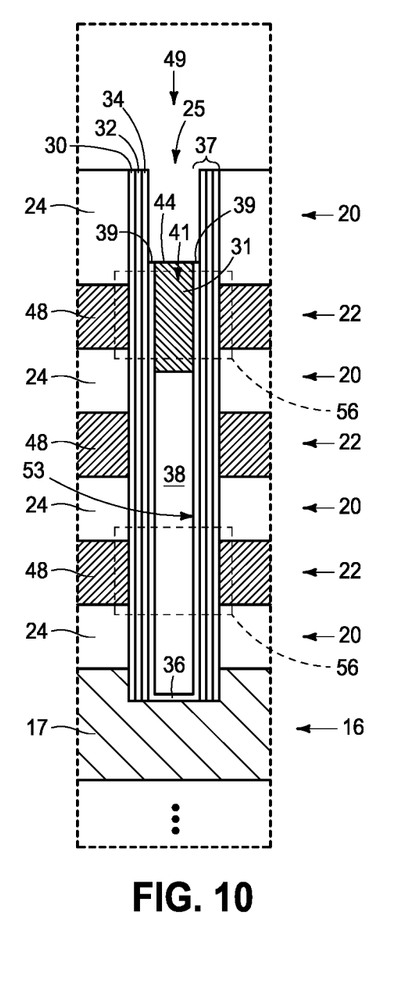

Referring to FIGS. 9 and 10, conductor-material contacts 41 and the cylindrical shell of individual channel-material strings 53 have been vertically recessed (e.g., by wet or dry etching) relative to storage material 32 (at least relative thereto) in individual channel openings 25. In one embodiment and as shown, conductor-material contacts 41 in individual channel openings 25 individually have a top 44 that is above uppermost first tier 22 after the act of vertical recessing. In one embodiment, the vertical recessing of conductor-material contacts 41 and the vertical recessing of the cylindrical shells occur at the same time. The cylindrical shell of individual channel-material strings comprises a top 39.

Figure 11:
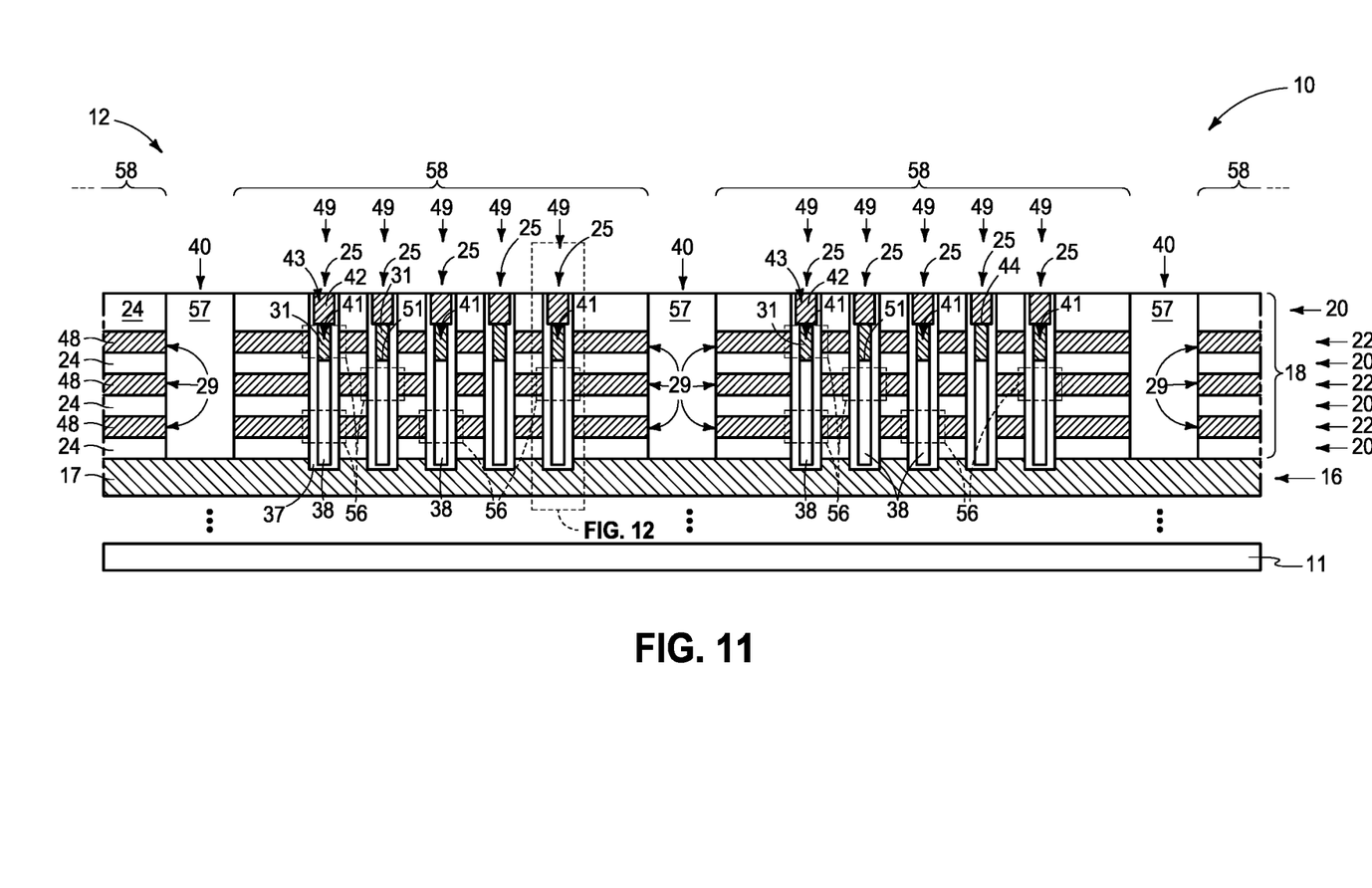
Figure 12:
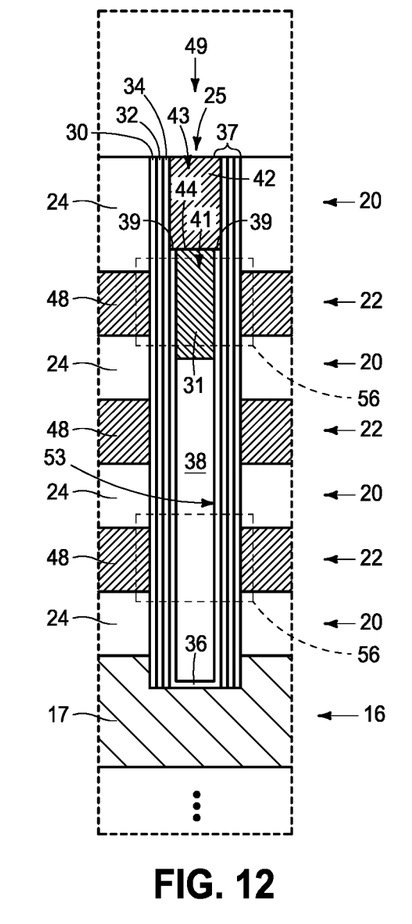

Referring to FIGS. 11 and 12, conductive material 42 (e.g., elemental tungsten atop a thin layer of TiN) has been formed atop construction 10 of FIGS. 9 and 10, thereby forming a conductive via 43 in individual channel openings 25 directly against top 39 of the vertically-recessed cylindrical shell of channel-material string 53 and directly against top 44 of vertically-recessed conductor-material contact 41 that are in that individual channel opening 25. Conductive material 42 and conductor material 31 may be of the same composition relative one another or may comprise different compositions relative one another. Regardless, a conducting interface 44 ("conducting" as materials 42 and 31 are conducting, and essentially the same as the line designated top 44) is between conductive material 42 and conductor material 31. By way of example, conductive material 42 may be deposited to overfill the remaining volume of channel opening 25 in FIGS. 9 and 10, followed by planarizing such back at least to a top of uppermost second tier 20.

Figure 13:
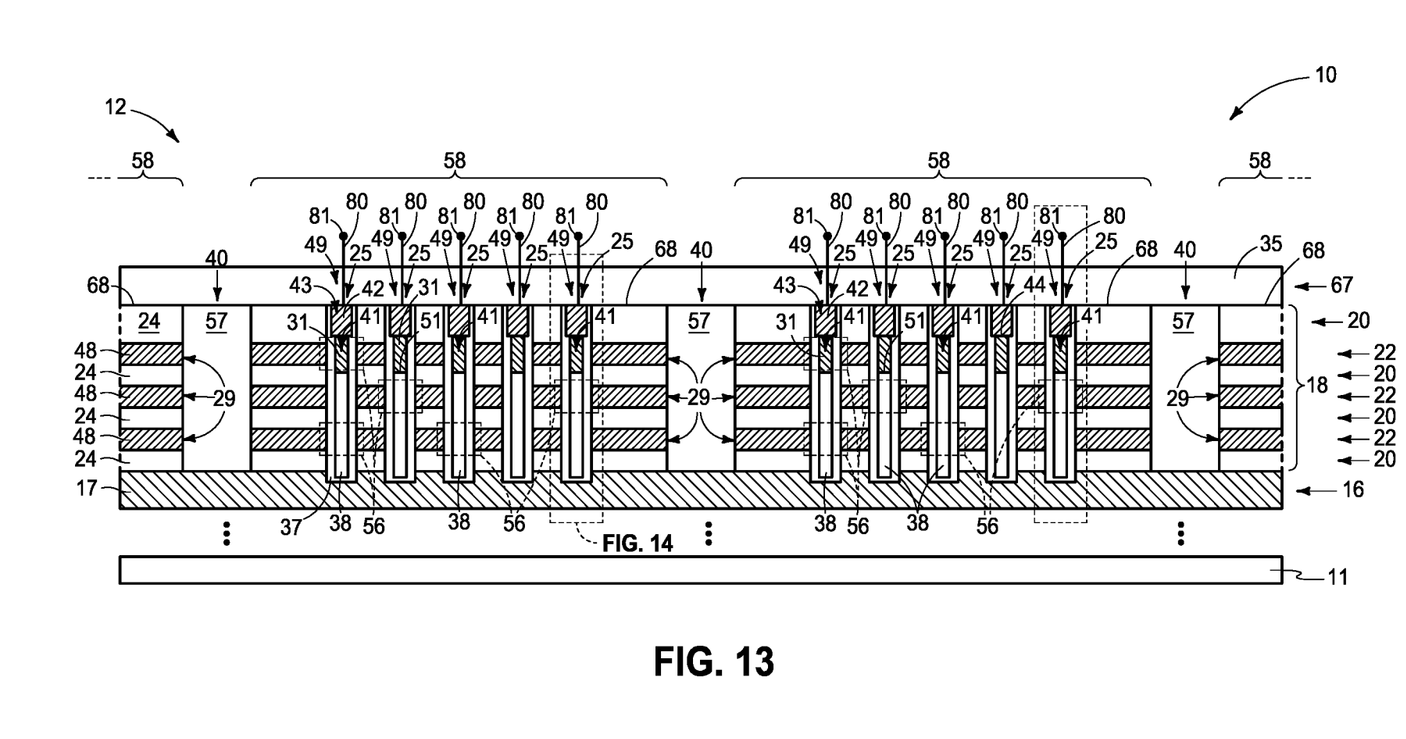
Figure 14:
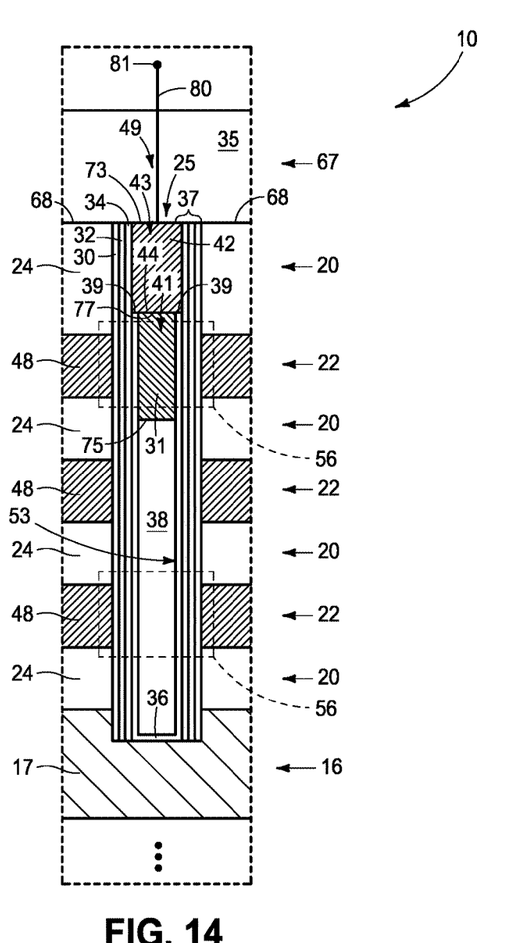

Referring to FIGS. 13 and 14, an insulator tier 67 comprising insulator material 35 has been formed directly above and directly against insulative material 24 of uppermost insulative tier 20. Insulator material 35 and insulative material 24 may be of the same composition relative one another or may comprise different compositions relative one another. Regardless, an insulating interface 68 ("insulating" as materials 35 and 24 are insulating) is between insulative material 24 and insulator material 35. Digitlines (not shown) may be formed within insulator material 35 of insulator tier 67 that directly electrically couple to one or more conductive vias 43. Alternately, by way of example only, additional conductive vias (not shown) may be formed in insulator material 35 of insulator tier 67 that individually directly electrically couple with conductive vias 43 and digitlines (not shown) may be formed there-atop which directly electrically couple to one or more such another vias (not shown). Such is diagrammatically and schematically shown by a conductive schematic line 80 (e.g., a digitline or an another conductive via) connecting with a node 81 (e.g., a digitline or a conductive connection to a digitline).

Any other attribute(s) or aspect(s) as shown and/or described herein with respect to other embodiments may be used in the embodiments shown and described with reference to the above embodiments.

In one embodiment, a method used in forming a memory array (e.g., 12) comprising strings (e.g., 49) of memory cells (e.g., 56) comprises forming a stack (e.g., 18) comprising vertically-alternating first tiers (e.g., 22) and second tiers (e.g., 20). A channel-material string (e.g., 53) is in individual channel openings (e.g., 25) in the vertically-alternating first tiers and second tiers. A conductor-material contact (e.g., 41) is in the individual channel openings directly against the channel material of individual of the channel-material strings. The conductor-material contacts are vertically recessed in the individual channel openings. A conductive via (e.g., 43) is formed in the individual channel openings directly against the vertically-recessed conductor-material contact in that individual channel opening. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). An uppermost of the insulative tiers comprises insulative material (e.g., 24). An insulator tier (e.g., 67) comprising insulator material (e.g., 35) is directly above and directly against the insulative material of the uppermost insulative tier. An insulating interface (e.g., 68) is between the insulative and insulator materials. Channel-material strings (e.g., 53) of memory cells (e.g., 56) are in the insulative tiers and the conductive tiers. A conductor-material contact (e.g., 41) is directly against the channel material (e.g., 36) of individual of the channel-material strings (e.g., regardless of whether the channel-material strings are entirely solid or comprise cylindrical shells). The conductor-material contact has a top (e.g., 44) that is below the insulating interface. A conductive via (e.g., 43) is directly above and directly against individual of the conductive-material contacts. A conducting interface (e.g., 44) is between the conductor-material contact and the conductive via. The conductive via has a top (e.g., 73) that is at or below the insulating interface ("at" being shown in FIGS. 13 and 14). In one embodiment, the conductor-material contact has a bottom (e.g., 75) that is below uppermost conductive tier 22. In one embodiment, the conductive via has a bottom (e.g., 77) that is above the uppermost conductive tier 22. Any other attribute(s) or aspect(s) as shown and/or described herein with respect to other embodiments may be used.

Figure 15:
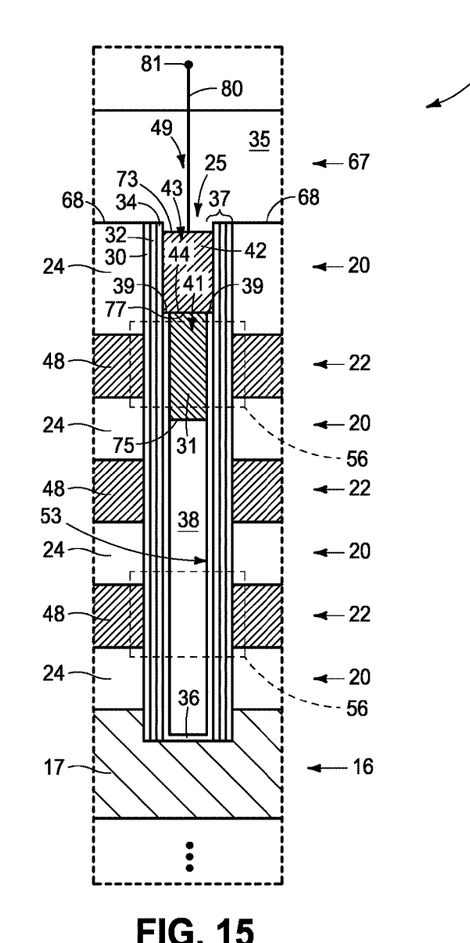
FIG. 15 shows an alternate example method and/or structural embodiment of the invention.

FIG. 15 shows an example alternate construction 10*a* wherein conductive-via tops 73 are below insulating interface 68. Like numerals from the above-described embodiments have been used where appropriate, with some construction differences being indicated with the suffix "a". Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). An uppermost of the insulative tiers comprises insulative material (e.g., 24). An insulator tier (e.g., 67) comprising insulator material (e.g., 35) is directly above and directly against the insulative material of the uppermost insulative tier. An insulating interface (e.g., 68) is between the insulative and insulator materials. Channel-material strings (e.g., 53) of memory cells (e.g., 56) are in the insulative tiers and the conductive tiers. Storage material (e.g., 32) is radially outside individual of the channel-material strings. The individual channel-material strings have a top (e.g., 39) that is below the insulating interface. The storage material has a top that is at or below the insulating interface. A conductor-material contact (e.g., 41) is directly against the channel material of the individual channel-material strings. A conductive via (e.g., 43) is directly above and directly against individual of the conductor-material contacts. A conducting interface (e.g., 44) is between the conductor-material contact and conductive via. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and; or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. A channel-material string is in individual channel openings in the vertically-alternating first tiers and second tiers. A conductor-material contact is in the individual channel openings directly against the channel material of individual of the channel-material strings. The conductor-material contacts are vertically recessed in the individual channel openings. A conductive via is formed in the individual channel openings directly against the vertically-recessed conductor-material contact in that individual channel opening.

In some embodiments, a method used in forming a memory array comprising strings of memory cells comprises forming a stack comprising vertically-alternating first tiers and second tiers. A channel-material string is in individual channel openings in the vertically-alternating first tiers and second tiers. The channel-material strings individually comprise a cylindrical shell. Insulator material is radially inside the cylindrical shell and storage material is radially outside the cylindrical shell. The insulator material is vertically recessed in the individual channel openings relative to the storage material and relative to the channel material. A conductor-material contact is formed in the individual channel openings radially inside of and directly against radially-inner sides of the cylindrical shell of the channel material of individual of the channel-material strings and atop the vertically-recessed insulator material. The conductor-material contacts and the cylindrical shell of the individual channel-material strings are vertically recessed relative to the storage material in the individual channel openings. A conductive via is formed in the individual channel openings directly against a top of the vertically-recessed cylindrical shell of the channel-material string and directly against a top of the vertically-recessed conductor-material contact that are in that individual channel opening.

In some embodiments, a memory array comprising strings of memory cells comprises laterally-spaced memory blocks individually comprising a vertical stack comprising alternating insulative tiers and conductive tiers. An uppermost of the insulative tiers comprises insulative material. An insulator tier comprising insulator material is directly above and directly against the insulative material of the uppermost insulative tier. An insulating interface is between the insulative and insulator materials. Channel-material strings of memory cells are in the insulative tiers and the conductive tiers. A conductor-material contact is directly against the channel material of individual of the channel-material strings. The conductor-material contact has a top that is below the insulating interface. A conductive via is directly above and directly against individual of the conductor-material contacts. A conducting interface is between the conductor-material contact and the conductive via. The conductive via has a top that is at or below the insulating interface.

In some embodiments, a memory array comprising strings of memory cells comprises laterally-spaced memory blocks individually comprising a vertical stack comprising alternating insulative tiers and conductive tiers. An uppermost of the insulative tiers comprises insulative material. An insulator tier comprising insulator material is directly above and directly against the insulative material of the insulative tier. An insulating interface is between the insulative and insulator materials. Channel-material strings of memory cells are in the insulative tiers and the conductive tiers. Storage material is radially outside individual of the channel-material strings. The individual channel-material strings have a top that is below the insulating interface. The storage material has a top that is at or below the insulating interface. A conductor-material contact is directly against the channel material of the individual channel-material strings. A conductive via is directly above and directly against individual of the conductor-material contacts. A conducting interface is between the conductor-material contact and the conductive via.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a stack comprising vertically-alternating first tiers and second tiers, the first tiers being conductive and the second tiers being insulative in a finished construction, a channel-material string being in individual channel openings in the vertically-alternating first tiers and second tiers, the channel-material strings individually comprising a cylindrical shell of the channel material, insulator material being radially inside the cylindrical shell of the channel material, storage material being radially outside the cylindrical shell of the channel material;
   vertically recessing the insulator material in the individual channel openings relative to the storage material and relative to the channel material;
   forming a conductor-material contact in the individual channel openings radially inside of and directly against radially-inner sides of the cylindrical shell of the channel material of individual of the channel-material strings and atop the vertically-recessed insulator material, the conductor-material contact having a bottom that is below a bottom of an uppermost of the first tiers;
   etching the conductor material of the conductor-material contact vertically-downward to vertically recess the conductor material relative to the storage material in the individual channel openings and etching the channel material of the cylindrical shell of the individual channel-material strings vertically-downward to vertically recess the cylindrical shell relative to the storage material in the individual channel openings, the conductor material after said etching thereof having a planar uppermost surface; and
   forming a conductive via in the individual channel openings directly against a top of the channel material of the vertically-recessed cylindrical shell of the channel-material string and directly against all of the planar uppermost surface of the vertically-recessed conductor-material contact that are in that individual channel opening.

2. The method of claim 1 wherein an uppermost of the second tiers is thicker than the second tier immediately there-below.

3. The method of claim 1 wherein an uppermost of the vertically-alternating first tiers and second tiers of the stack is a second tier at start of the vertical recessing, the vertical recessing positioning a top of the insulator material below an uppermost of the first tiers.

4. A method used in forming a memory array comprising strings of memory cells, comprising:
   forming a stack comprising vertically-alternating first tiers and second tiers, a channel-material string being in individual channel openings in the vertically-alternating first tiers and second tiers, the channel-material strings individually comprising a cylindrical shell of the channel material, insulator material being radially inside the cylindrical shell of the channel material, storage material being radially outside the cylindrical shell of the channel material;
   vertically recessing the insulator material in the individual channel openings relative to the storage material and relative to the channel material;
   forming a conductor-material contact in the individual channel openings radially inside of and directly against radially-inner sides of the cylindrical shell of the channel material of individual of the channel-material strings and atop the vertically-recessed insulator material;
   etching the conductor material of the conductor-material contact vertically-downward to vertically recess the conductor material relative to the storage material in the individual channel openings and etching the channel material of the cylindrical shell of the individual channel-material strings vertically-downward to vertically recess the cylindrical shell relative to the storage material in the individual channel openings, the conductor material after said etching thereof having a planar uppermost surface;
   forming a conductive via in the individual channel openings directly against a top of the channel material of the vertically-recessed cylindrical shell of the channel-material string and directly against all of the planar uppermost surface of the vertically-recessed conductor-material contact that are in that individual channel opening; and
   the etching of the conductor material of the conductor-material contact and the etching of the channel material of the cylindrical shell occurring at the same time.

5. The method of claim 1 comprising forming the conductive material of the conductive via to extend laterally-outward beyond a side of the conductor material of the conductor-material contact in a vertical cross-section.

6. The method of claim 1 comprising forming the conductive material of the conductive via to extend laterally-outward beyond two laterally-opposing sides of the conductor material of the conductor-material contact in a vertical cross-section.

7. The method of claim 1 wherein the conductor-material contact has a top that is above a top of the uppermost conductive tier.

8. The method of claim 1 wherein an uppermost of the second tiers comprises insulative material, an insulating tier comprising insulating material being directly above and directly against the insulative material of the uppermost second tier, an insulating interface being between the insulative and insulating materials, the conductive via having its top at or below the insulating interface.

9. The method of claim 8 wherein the conductive-via top is at the insulating interface.

10. The method of claim 8 wherein the conductive-via top is below the insulating interface.

11. A method used in forming a memory array comprising strings of memory cells, comprising:
   forming a stack comprising vertically-alternating first tiers and second tiers, the first tiers being conductive and the second tiers being insulative in a finished construction, a channel-material string being in individual channel openings in the vertically-alternating first tiers and second tiers, the channel-material strings individually comprising a cylindrical shell, insulator material being radially inside the cylindrical shell, storage material being radially outside the cylindrical shell;
   vertically recessing the insulator material in the individual channel openings relative to the storage material and relative to the channel material;
   forming a conductor-material contact in the individual channel openings radially inside of and directly against radially-inner sides of the cylindrical shell of the channel material of individual of the channel-material strings and atop the vertically-recessed insulator material, the conductor-material contact having a bottom that is below a bottom of an uppermost of the first tiers;
   vertically recessing the conductor-material contacts and the cylindrical shell of the individual channel-material strings relative to the storage material in the individual channel openings; and
   forming a conductive via in the individual channel openings directly against a top of the vertically-recessed cylindrical shell of the channel-material string and directly against a top of the vertically-recessed conductor-material contact that are in that individual channel opening.

12. The method of claim 11 wherein an uppermost of the second tiers comprises insulative material, an insulating tier comprising insulating material being directly above and directly against the insulative material of the uppermost second tier, an insulating interface being between the insulative and insulating materials, the conductive via having its top at or below the insulating interface.

13. The method of claim 12 wherein the conductive-via top is at the insulating interface.

14. The method of claim 12 wherein the conductive-via top is below the insulating interface.

* * * * *